United States Patent [19]
Burton et al.

[11] Patent Number: 5,310,076
[45] Date of Patent: May 10, 1994

[54] SNAP-ON LID FOR COMPUTER CHIP TRAY

[75] Inventors: Don E. Burton; Richard Vazquez, both of Melville, N.Y.

[73] Assignee: Arrow Electronics, Inc., Melville, N.Y.

[21] Appl. No.: 963,123

[22] Filed: Oct. 19, 1992

[51] Int. Cl.⁵ .................................................. B65D 51/00
[52] U.S. Cl. ..................................... 220/377; 220/306; 206/45.34; 206/328; 206/334
[58] Field of Search ............... 206/45.32, 45.34, 328, 206/329, 332, 334; 220/377, 306, 353, 355, 356, 623

[56] References Cited

U.S. PATENT DOCUMENTS

| | | | |
|---|---|---|---|
| 3,351,227 | 11/1967 | Collie | 220/306 |
| 3,353,708 | 11/1967 | Davis | 220/306 |
| 3,523,608 | 8/1970 | Miller | 220/377 |
| 3,532,244 | 10/1970 | Yates, Jr. | 220/306 |
| 3,576,271 | 4/1971 | Seeley | 220/377 |
| 3,645,281 | 2/1972 | Seidler | 206/328 |
| 3,675,811 | 7/1972 | Artz | 220/306 |
| 3,684,817 | 8/1972 | Card, Jr. et al. | 206/328 |
| 3,744,663 | 7/1973 | Moren | 220/306 |
| 3,837,526 | 9/1974 | Medendorp | 206/45.34 |
| 3,945,490 | 3/1976 | Thompson | 220/306 |
| 3,979,016 | 9/1976 | Frater | 220/356 |
| 3,999,677 | 12/1976 | Oberkircher | 220/355 |
| 4,200,191 | 4/1980 | Nakamura et al. | 206/328 |
| 4,206,854 | 6/1980 | Takami | 220/355 |
| 4,235,338 | 11/1980 | Dugan et al. | 220/306 |
| 4,351,447 | 9/1982 | Graff | 220/306 |
| 4,375,862 | 3/1983 | Kurinsky et al. | 206/45.32 |
| 4,733,778 | 3/1988 | Beockman et al. | 206/328 |
| 4,750,614 | 6/1988 | Fischer et al. | 220/377 |
| 4,805,797 | 2/1989 | Natori | 220/306 |
| 4,842,135 | 6/1989 | Borst et al. | 206/328 |
| 4,863,023 | 9/1989 | Payne et al. | 206/45.34 |
| 5,103,993 | 4/1992 | Bingisser | 220/306 |

Primary Examiner—David T. Fidei
Attorney, Agent, or Firm—Kane, Dalsimer, Sullivan, Kurucz, Levy, Eisele and Richard

[57] ABSTRACT

The apparatus is a snap-on lid for JEDEC trays for surface mount components (SMCs) and other computer chips. The JEDEC trays hold the surface mount components and the lid snap fits over the JEDEC tray engaging the hold-down tabs thereof.

2 Claims, 5 Drawing Sheets

SNAP-ON LID FOR COMPUTER CHIP TRAY

BACKGROUND OF THE INVENTION

1. Field of the Invention

This invention pertains to the field of holders for surface mount components or computer chips. More particularly, this invention pertains to a snap-on lid for a JEDEC tray for computer chips.

2. Description of the Prior Art

In the prior art, the extreme sensitivity of surface mount components (SMCs or, more commonly, computer chips) to electrostatic discharge (static electricity) and electromagnetic interference, as well as poor handling and soldering defects due to high moisture content is well known. This sensitivity becomes particularly important in the transportation or handling of computer chips. In order to transport computer chips from one place to another, several types of apparatus have been designed to shield computer chips from static electricity, electromagnetic interference, poor handling and high moisture.

Representative of these prior art attempts are U.S. Pat. Nos. 5,115,912; 5,109,981; 5,064,064; 5,058,743; 5,038,248; 5,024,329; 4,886,163; 4,767,003; 4,706,161; 4,702,371; 4,666,545; 4,595,096; 4,528,222; 4,448,306; and 4,426,675.

More particularly, with respect to tray type holders, U.S. Pat. No. 4,767,003 discloses a stack of trays for holding electronic components. Similarly, U.S. Pat. Nos. 5,115,912 and 5,109,981 disclose electric component carriers with downwardly extending legs which are formed to engage a frame.

However, these prior art attempts have not been as economical and as widely accepted as the JEDEC (Joint Electronic Device Engineering Counsel) trays. JEDEC trays are injection molded. They are designed and built in compliance with JEDEC standard outline dimensions. Tray markings contain a vendor information block, revision level and a device information block. The corner adjacent to the markings is notched for identifying the component pin-1 orientation. The number of components per tray varies with the size of the components. JEDEC trays have locating and hold-down tabs designed for automatic assembly equipment. JEDEC trays are stackable and are used as transport carriers during the component manufacturing processes. JEDEC trays meet many SMC protective and handling requirements for manufacturers and customers.

SMC manufacturers package 4 to 6 trays per box depending on the part quantity. Extra trays are used to hold down the parts in the top tray and protect the leads of the parts in the bottom tray (see FIGS. 1 and 2). In the prior art, manufacturers have been known to use as covers plastic or cardboard sheets tied or strapped to a stack of JEDEC trays with rubber bands, wire ties, cable ties, Velcro ® strapping or plastic strapping prior to placing the trays into the shipping boxes.

However, when a customer of a distributor orders a portion of the contents of a factory sealed box, the distributor frequently is forced to obtain an empty JEDEC tray, at an expense of approximately five dollars, to use as a top lid for the order. This can easily double the packaging expense for small orders, such as when a first JEDEC tray is used as a carrier and the second JEDEC tray is used as a lid.

OBJECTS AND SUMMARY OF THE INVENTION

It is therefore an object of this invention to provide an inexpensive way to package SMCs or computer chips, particularly when less than a full factory sealed box or full tray is ordered by a customer from a distributor.

It is therefore a further object of this invention to provide anti-static protection to packaged SMCs or computer chips, particularly when these components are being transported in a JEDEC tray.

These and other objects are achieved by providing a snap-on lid which engages the JEDEC tray. Preferably, this lid is made from clear anti-static plastic. Further, this lid preferably engages the hold-down tabs of the JEDEC trays, these hold-down tabs being otherwise designed for automatic assembly equipment.

BRIEF DESCRIPTION OF THE DRAWINGS

Further objects and advantages of the invention will become apparent from the following description and claims, and from the accompanying drawings, wherein:

DETAILED DESCRIPTION OF THE PREFERRED EMBODIMENT

Figure 1:
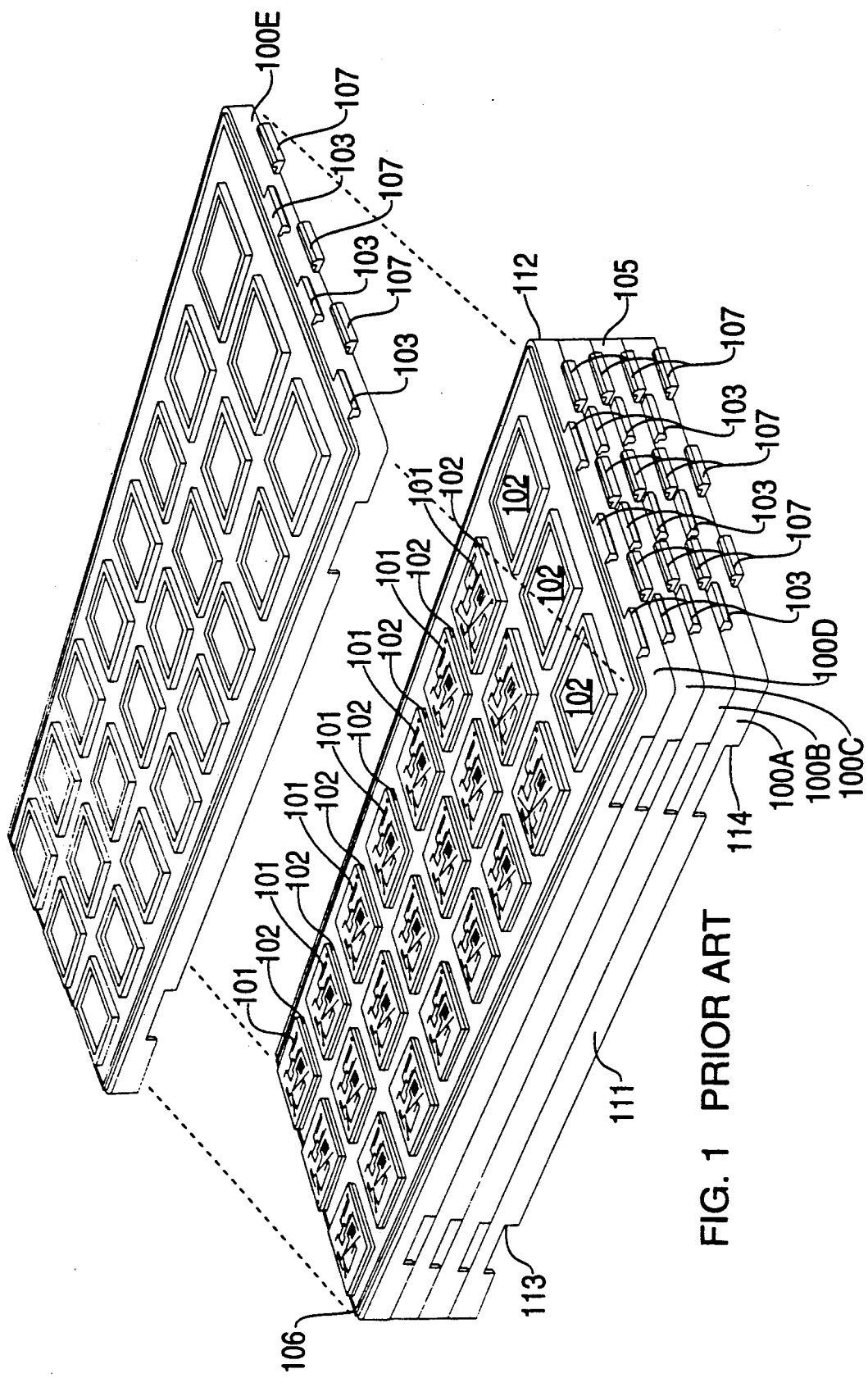
FIG. 1 is a perspective view, partially exploded, of the an empty JEDEC tray being used as a lid for a stack of JEDEC trays as would be done in the prior art.
Figure 2:
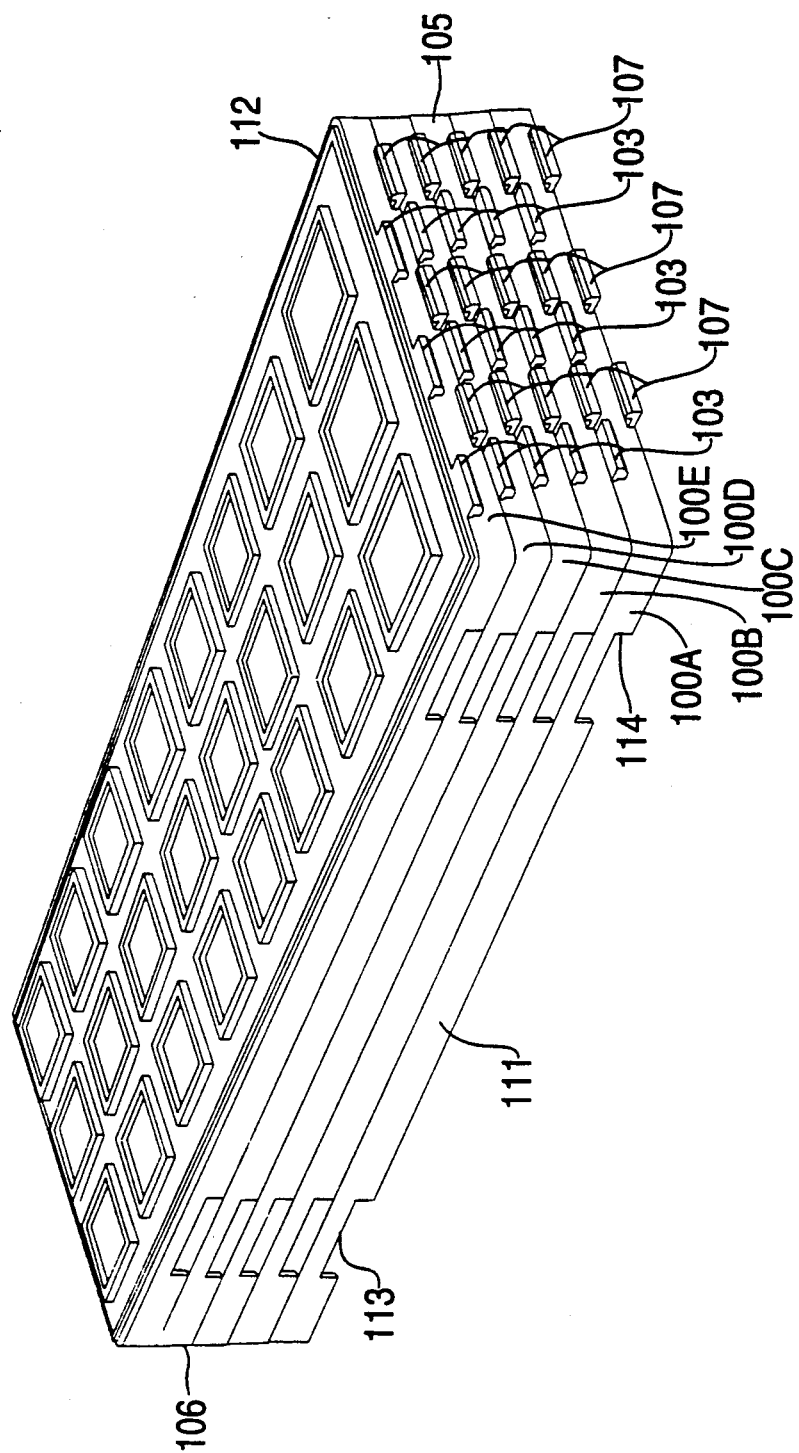
FIG. 2 is a perspective unexploded view of an empty JEDEC tray being used as a lid for as stack of JEDEC trays as would be done in the prior art.

Referring now to the drawings in detail wherein like numerals indicate like elements throughout the several views, one sees that FIG. 1 is a perspective view, partially exploded of prior art stackable JEDEC trays $100_A$, $100_B$, $100_C$, $100_D$ which hold some number of SMCs 101 (or similar chips) within apertures 102 with an empty JEDEC tray $100_E$ being used as a lid. FIG. 2 shows the same configuration but in an unexploded view.

JEDEC trays $100_A$–$100_E$ include upper hold-down tabs 103 with downwardly opening slots 104 (see FIGS. 5A and 5B for more detail) on an upper side of shorter ends 105, 106. Likewise, JEDEC trays $100_A$–$100_E$ include lower hold-down tabs 107 with upwardly opening slots 108 on a lower side of shorter ends 105, 106. Hold-down tabs 103, 107 were originally designed to orient trays $100_A$–$100_E$ during automatic assembly equipment. Longer ends 111, 112 of JEDEC trays $100_A$–$100_E$ include notches 113, 114 which are similarly used in connection with automatic assembly equipment.

While FIGS. 1 and 2 show a plurality of JEDEC tray $100_A$–$100_D$ virtually full of SMCs 101, it is to be noted that the present invention is equally applicable to a smaller number of trays and a smaller number of SMCs.

In fact, the economics of the present invention is more effective with a smaller number of trays and a smaller number of SMCs as tray $100_E$ represents a larger portion of the packaging cost per chip in such smaller applications.

Figure 3:
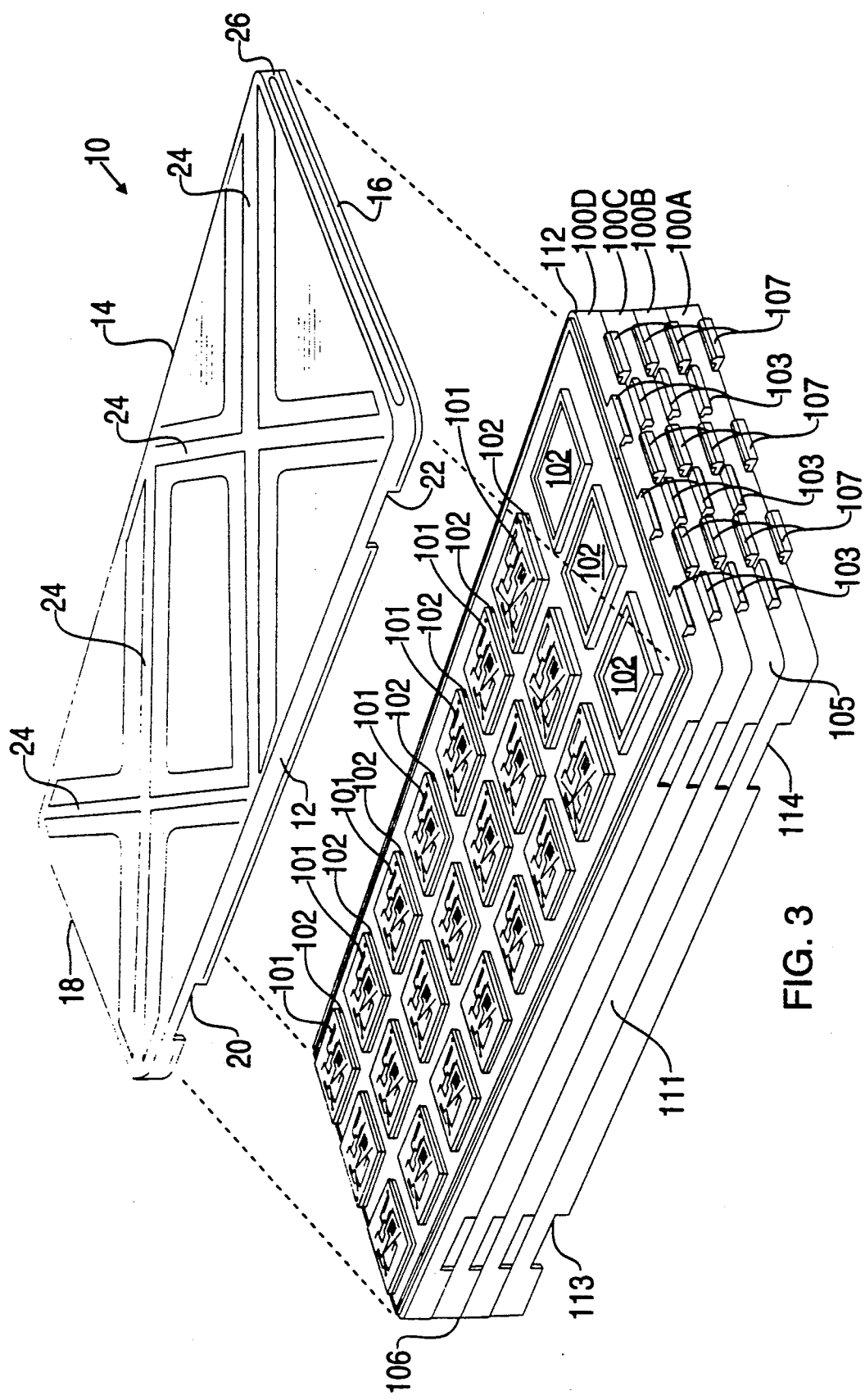
FIG. 3 is a perspective view, partially exploded, of the snap-on lid of the present invention being used as a lid for a stack of JEDEC trays.
Figure 4:
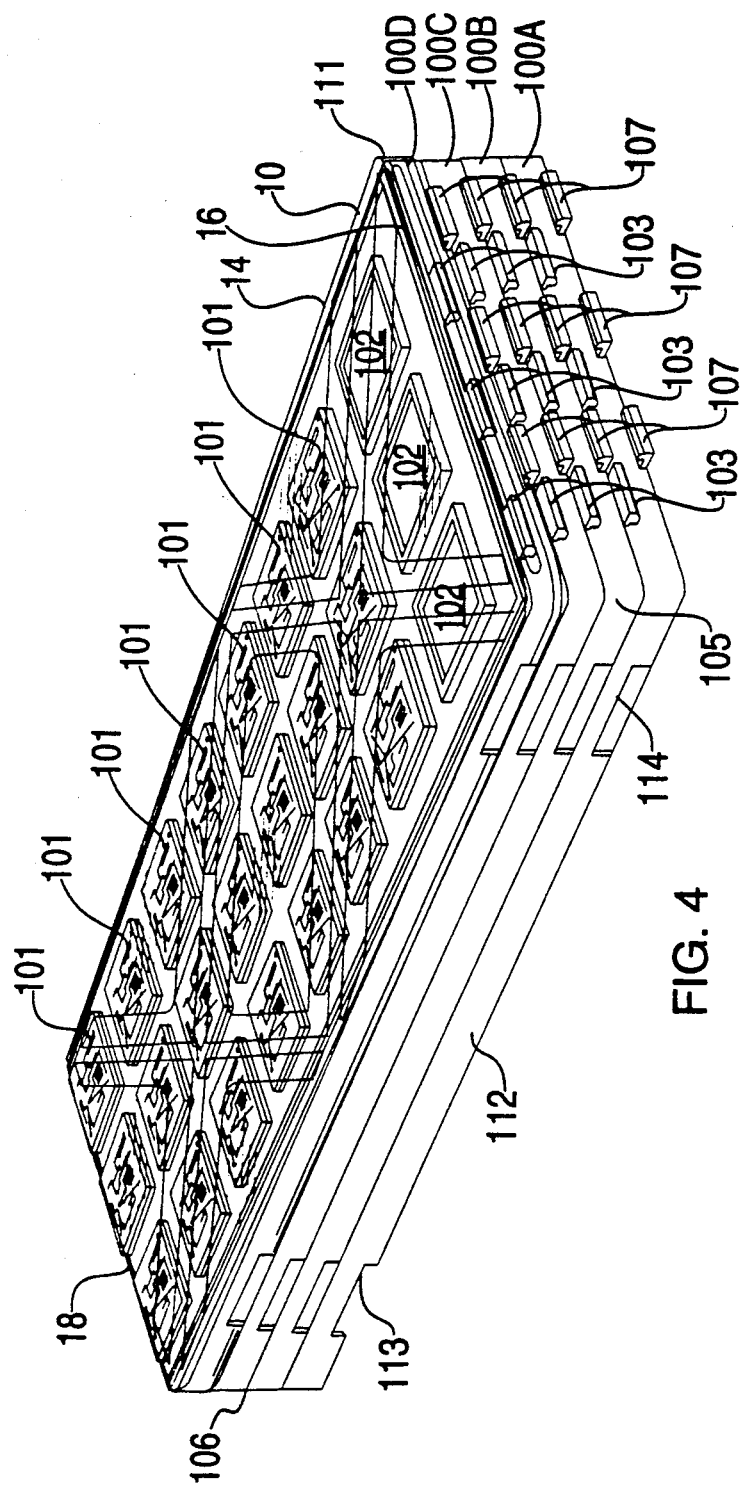
FIG. 4 is a perspective unexploded view of the snap-on lid of the present invention being used as a lid for a stack of JEDEC trays.

Referring now to FIGS. 3 and 4, one sees that lid 10 is substituted for the tray $100_E$ of FIGS. 1 and 2, respectively. As lid 10 is made of thin clear anti-static plastic, it should be immediately apparent that there is an economic savings, as well as a shipping weight and shipping volume savings, by the use of lid 10 in lieu of tray $100_E$.

Lid 10 includes longer ends 12, 14 and shorter ends 16, 18 which substantially correspond to longer ends 111, 112 and shorter ends 105, 106, respectively, of trays $100_A$–$100_D$. Longer ends 12, 14 include notches 20, 22 which substantially correspond to notches 113, 114 of trays $100_A$–$100_D$, when lid 10 is snapped onto tray $100_D$ as shown in FIG. 4.

Lid 10 further includes ribs 24 which strengthen lid 10 against flexure.

Figure 5A:
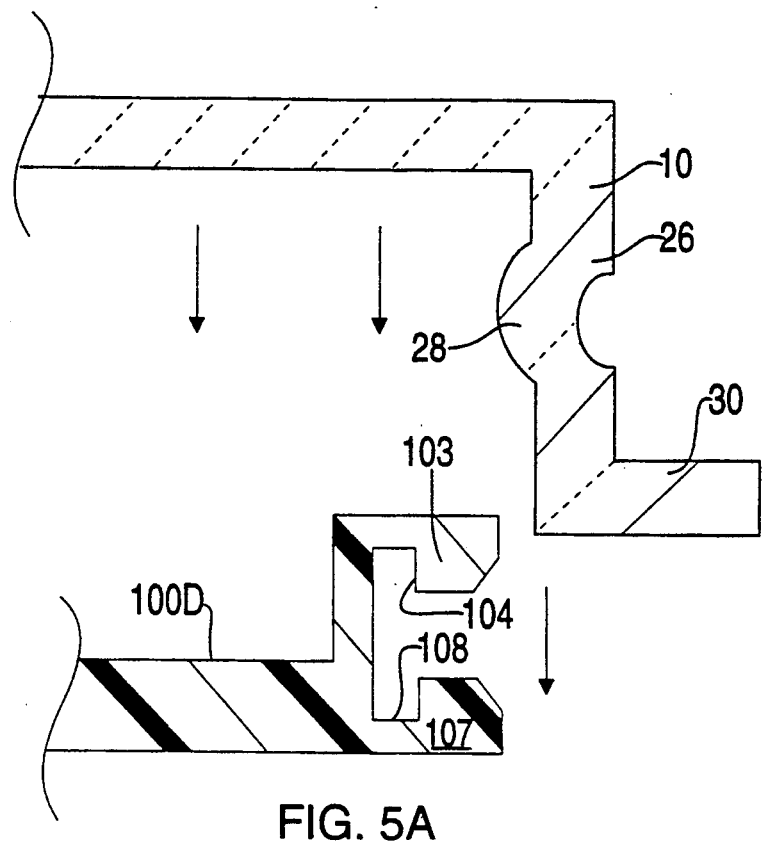
FIG. 5A is a cross-sectional view, partially exploded, of the lip of the snap-on lid of the present invention engaging the hold-down tabs of the JEDEC tray.
Figure 5B:
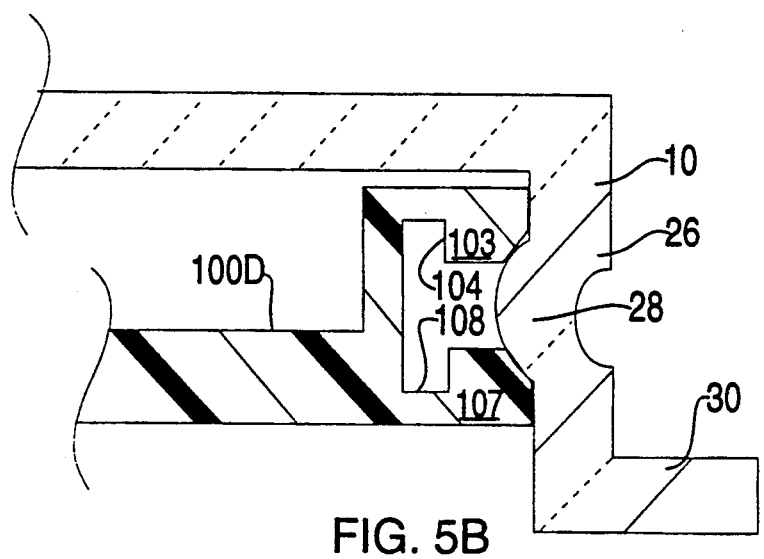
FIG. 5B is a cross-sectional unexploded view of the lip of the snap-on lid of the present invention engaging the hold-down tabs of the JEDEC tray.

Longer ends 12, 14 and shorter ends 16, 18 have downwardly extending lip 26 (see FIGS. 5A and 5B for cross-sectional detail). The portions of lip 26 which downwardly extend from shorter ends 16, 18 include inwardly extending detent ridge 28. Inwardly extending detent ridge 28 snap fits between upper and lower holddown tabs 103, 107 to engage lid 10 against tray $100_D$ as shown in FIG. 5B.

The lower portion of lip 26 further includes outwardly extending tongue 30 to allow the user to grip lid 10 firmly to engage or disengage the same from tray $100_D$.

To use lid 10, the user fills one or more JEDEC trays such as $100_D$ with one or more SMC's 101 and snaps lid 10 over the tray $100_D$ as shown in FIGS. 5A and 5B. Additionally, the user may wish to include an anti-static foam sheet (not shown) between the tray $100_D$ and lid 10 so as to protect the SMC's 101. The user then ships the resulting configuration as desired.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. A lid for snap engaging a tray holding electronic components, said tray including sidewall notches used with automatic assembly equipment, said lid comprising:

a substantially planar panel with two opposed longer ends and two opposed shorter ends in a rectangular configuration, said panel further including reinforcing ribs;

a downwardly extending skirt around a periphery of said panel, including an outwardly extending tongue along at least a portion of a lower edge of said downwardly extending skirt, said downwardly extending skirt including notches along a lower edge directly below said longer ends of said panel, to along with corresponding notches on said tray, and an inwardly extending ridge formed only on an inner surface on said downwardly extending skirt directly below at least one of said two opposed shorter ends of said panel such that said ridge is absent from said downwardly extending skirt directly below said two opposed longer ends of said panel.

2. The lid of claim 1 wherein said outwardly extending tongue is formed around an entire periphery of said lower edge except for where said notches are formed.

* * * * *